United States Patent
Plum et al.

(10) Patent No.: US 11,320,479 B2
(45) Date of Patent: May 3, 2022

(54) SEMICONDUCTOR DEVICE WITH A DATA-RECORDING MECHANISM

(71) Applicant: Micron Technology, Inc., Boise, ID (US)

(72) Inventors: Todd J. Plum, Boise, ID (US); Scott D. Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 16/138,900

(22) Filed: Sep. 21, 2018

(65) Prior Publication Data

US 2020/0096556 A1    Mar. 26, 2020

(51) Int. Cl.
  *G01R 31/28* (2006.01)
  *G11C 11/401* (2006.01)

(52) U.S. Cl.
  CPC ..... *G01R 31/2837* (2013.01); *G01R 31/2849* (2013.01); *G11C 11/401* (2013.01)

(58) Field of Classification Search
  CPC .............. G01R 31/28; G01R 31/2837; G01R 31/2849; G11C 11/4076; G11C 29/00; G11C 7/04; G11C 11/401; G11C 11/4078; G11C 11/22; G06F 9/542; H01L 24/06; H01L 2924/14
  USPC .................................................. 324/762.01
  See application file for complete search history.

(56) References Cited

U.S. PATENT DOCUMENTS

| | | | |
|---|---|---|---|
| 9,257,995 B2 | 2/2016 | Van De Graaff | |
| 10,114,068 B1* | 10/2018 | Chen | G01R 31/2879 |
| 2016/0116529 A1* | 4/2016 | Cho | G01R 31/2874 |
| | | | 324/750.06 |
| 2016/0223609 A1* | 8/2016 | Hwang | G01R 31/2644 |
| 2017/0168109 A1* | 6/2017 | Kobashi | G06F 3/0653 |
| 2017/0299650 A1* | 10/2017 | Coyne | G01R 31/2879 |
| 2018/0156859 A1* | 6/2018 | Takeuchi | G01R 31/2642 |

OTHER PUBLICATIONS

Chaudhary, S. K. et al., "Development of Field Data Logger for Recording Mission Profile of Power Converters", 2015 17th European Conference on Power Electronics and Applications, Sep. 8-10, 2015, p. 1-10 DOI: 10.1109/EPE.2015.7311717.

(Continued)

*Primary Examiner* — Jermele M Hollington
*Assistant Examiner* — Courtney G McDonnough
(74) *Attorney, Agent, or Firm* — Perkins Coie LLP

(57) ABSTRACT

An electronic device includes: a detection circuit configured to determine one or more operating data, one or more device sensor data, or a combination thereof associated with operation of the electronic device; a trigger circuit operably coupled to the circuit, the trigger circuit configured to generate a stress input based on detecting one or more target criteria from the one or more operating data, the one or more device sensor data, or a combination thereof; and a degradation sensor operably coupled to the trigger circuit, the degradation sensor having a threshold voltage and being configured to record the target criteria that occurs during operation of the electronic device, wherein the degradation sensor is configured to record the target criteria based on degradation of the threshold voltage according to the stress input.

19 Claims, 5 Drawing Sheets

(56) References Cited

OTHER PUBLICATIONS

Huard, V. et al., "Adaptive Wearout Management with in-situ aging monitors", 2014 IEEE International Reliability Physics Symposium, Jun. 1-5, 2014, p. 6B.4.1-6B.4.11, DOI: 10.1109/IRPS.2014.6861106.

Liang, et al., "Mission Profiles Derived from Lifetests and Field Return Data Using Inverse Problem Theory", 2014 IEEE International Reliability Physics Symposium, Jun. 1-5, 2014, p. 3B.2.1-3B.2.5, DOI: 10.1109/IRPS.2014.6860616.

Lu, P.-F. et al., "Long-term data for BTI degradation in 32nm IBM microprocessor using HKMG technology", 2015 IEEE International Reliability Physics Symposium, Apr. 19-23, 2015, p. 6A.2.1-6A.2.5, DOI: 10.1109/IRPS.2015.7112756.

Mhira, S. et al., "Mission profile recorder: An aging monitor for hard events", 2016 IEEE International Reliability Physics Symposium (IRPS), Apr. 17-21, 2016, p. 4C-3-1-4C-3-5, DOI: 10.1109/IRPS.2016.7574539.

\* cited by examiner

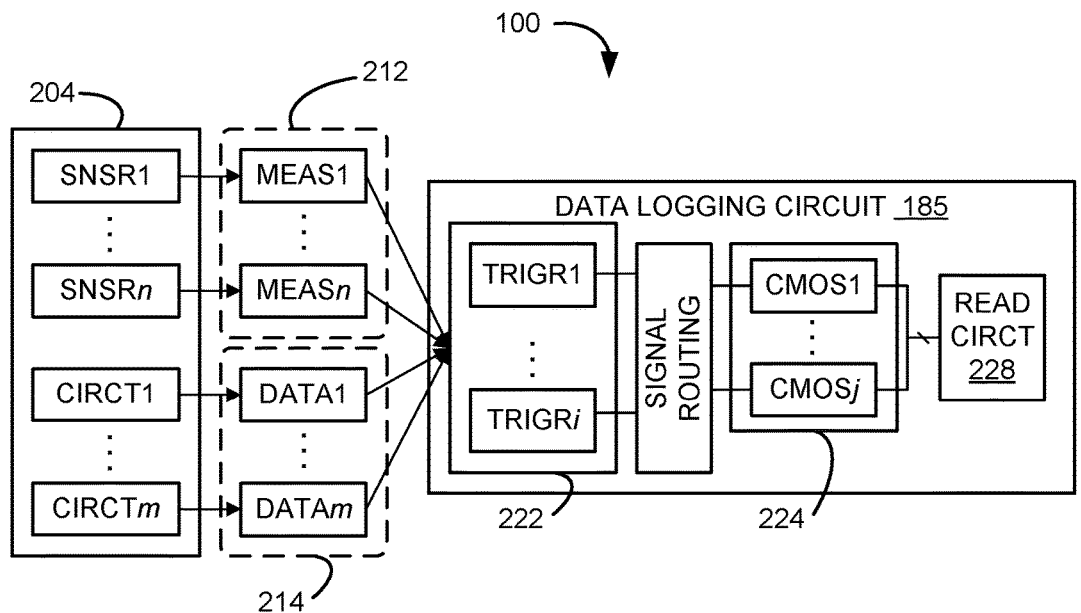
FIG. 2
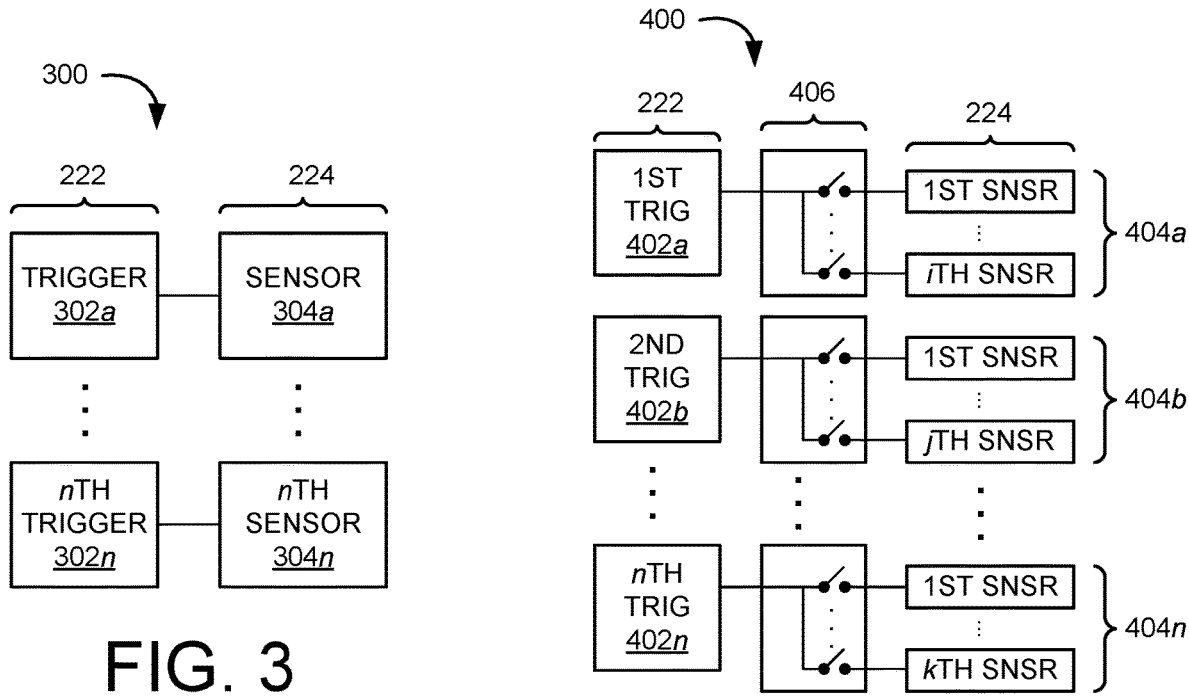
FIG. 3
FIG. 4

SEMICONDUCTOR DEVICE WITH A DATA-RECORDING MECHANISM

TECHNICAL FIELD

The disclosed embodiments relate to semiconductor devices, and, in particular, to memory devices with a data-recording mechanism.

BACKGROUND

Semiconductor devices (e.g., processors, memory systems, etc.) can include semiconductor circuits configured to store and/or process information. For example, the memory devices can include volatile memory devices, non-volatile memory devices, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

To facilitate the collection of data about the utilization and real-world operating parameters of a semiconductor device, it can be helpful to implement data loggers into the device to monitor and record such data during device usage for later retrieval (e.g., in diagnosing failures in returned devices, or for collecting population data to improve the understanding of operating conditions and environments in which products are routinely used). For products that are expected to be used for a long time before the data can be retrieved (e.g., memory devices with a multi-year expected lifespan), the cost of traditional data logging approaches (e.g., non-volatile memory storing binary-encoded log events) can become prohibitive.

BRIEF DESCRIPTION OF THE DRAWINGS

FIG. 2 illustrates a block diagram of a data logging circuit in accordance with an embodiment of the present technology.

FIG. 3 illustrates a block diagram of a connection scheme within the data logging circuit of FIG. 2 in accordance with an embodiment of the present technology.

FIG. 4 illustrates a block diagram of a connection scheme within the data logging circuit of FIG. 2 in accordance with a further embodiment of the present technology.

DETAILED DESCRIPTION

Figure 1:
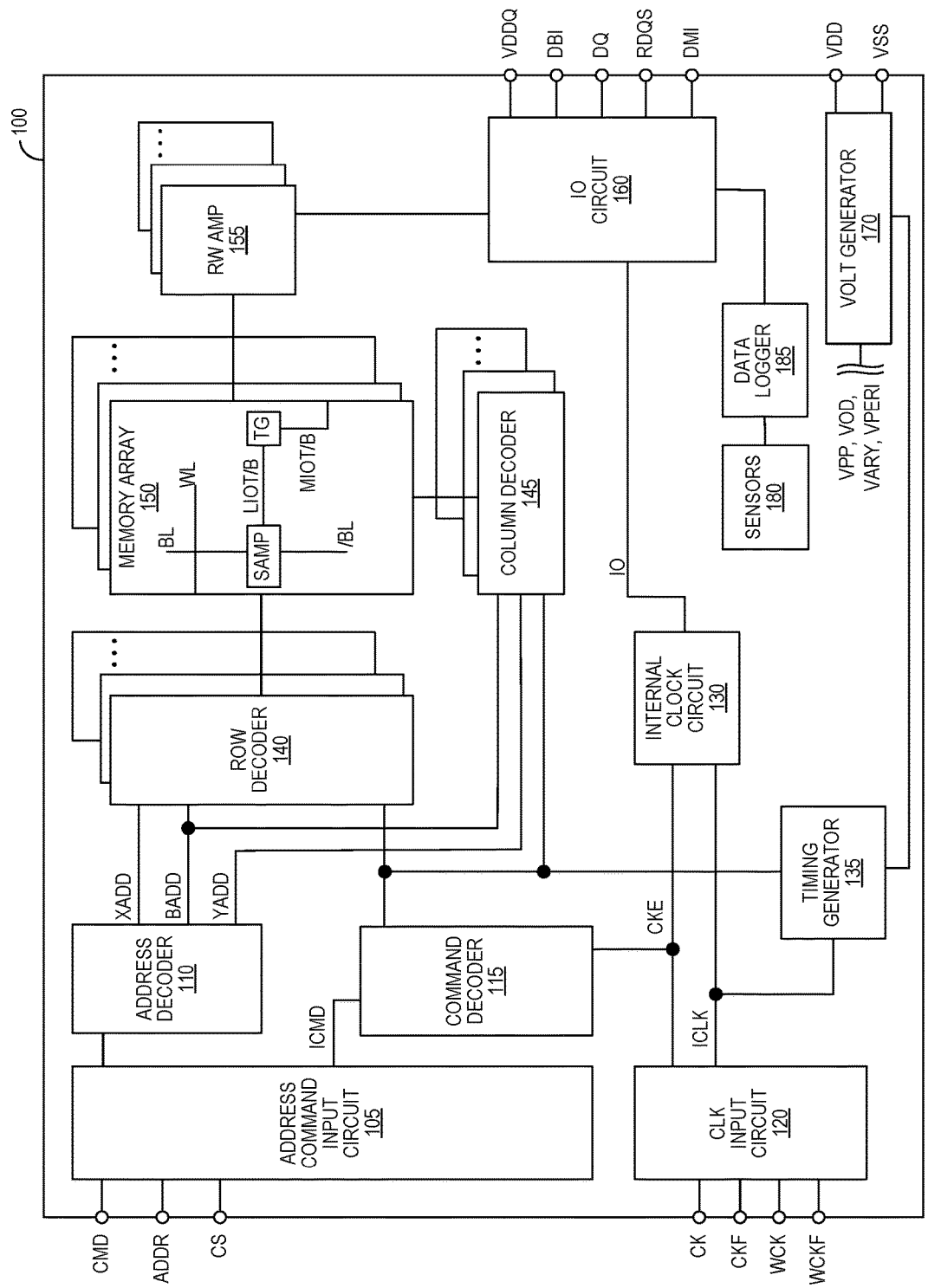
FIG. 1 is a block diagram of a memory device in accordance with an embodiment of the present technology.

As an alternative to a non-volatile memory-based data logger, it is possible to store relevant operating data in less power- and space-inefficient ways. For example, if a desired type of operating data involves a duration over which an operating parameter has been experienced (e.g., how many hours a device has been operated in a particular operating temperature range), data logging circuits which utilize a time-dependent change of a material property can be utilized. One such data logging circuit involves a CMOS circuit that experiences a material degradation proportional to the time for which a known voltage has been applied to a gate thereof. By utilizing such CMOS degradation-based data-logging circuits to measure the durations over which different operating parameters have been experienced by a device, it is possible to obtain large quantities of valuable operating data with a small investment of circuit space and power.

As described in greater detail below, the technology disclosed herein relates to electronic systems, including memory devices, systems with memory devices, and related methods for storing conditional and/or usage information thereof. The electronic systems (e.g., DRAM devices) can include degradation-based storage circuits (e.g., a CMOS degradation-based data-logger) configured to collect and store information regarding the duration for which different operating characteristics (e.g., device modes) and/or environmental conditions (e.g., device operating temperatures), are experienced by the electronic systems.

The degradation-based storage circuits can function as low-cost embedded data-loggers that record various information related to an end-user's utilization of the electronic devices/systems. The recorded usage information, such as the duration for which different temperature ranges, operating modes, asserted signals, utilized addresses, etc. were experienced can be used to diagnose failures, improve usage models, revise design specifications, etc.

In some embodiments, the degradation-based storage circuits can each include a trigger circuit corresponding to a desired parameter or combination of parameters for which a duration is to be measured for coupling a predetermined voltage to the gate of a CMOS device to cause degradation for the duration in which the targeted condition or criteria is active. By degrading the corresponding CMOS device each time the targeted condition(s) occur during operation of the electronic devices/systems, the cumulative degradation of the CMOS device (which can be measured with a circuit that measures a trigger voltage of the CMOS device) can be used to determine the cumulative duration for which the corresponding trigger condition was active.

Because the potential degradation of a single CMOS device is not infinite, various embodiments of the present disclosure provide various connection topologies for connecting multiple CMOS devices to one or more trigger circuits so that exhausted CMOS devices can be swapped for not-yet-degraded CMOS devices, to continue monitoring durations longer than a single CMOS device could measure. For example, in some embodiments, a trigger circuit can be operably coupled to a dedicated set of CMOS devices through a set of one or more switches, whereby a predetermined pool of CMOS devices is available to each trigger circuit (e.g., providing a predetermined maximum potential duration that can be measured for the trigger condition corresponding to that trigger circuit). In another embodiment, a set of multiple trigger circuits can be operably coupled to a set of general-use CMOS devices through a configurable switch matrix, whereby a predetermined pool of CMOS devices is shared among multiple trigger circuits (e.g., providing a predetermined maximum potential duration that can be allocated as needed among multiple trigger circuits).

In accordance with various embodiments of the present disclosure, a CMOS degradation-based data-logging device can include PMOS devices configured to degrade, where the amount of degradation represents the duration of a targeted condition/criteria, based on the stress associated with negative bias temperature instability (NBTI). In other embodiments, the CMOS devices can include NMOS devices configured to degrade based on the stress associated with low current channel hot carrier (CHC).

In some embodiments, the degradation-based storage circuits can degrade by different amounts according to the temperature of the memory device during the application of the predetermined voltage to the gate of the CMOS circuit. Accordingly, in some embodiments, temperature compensation can be provided by including an operating temperature range as one of the trigger conditions for the CMOS circuit (e.g., such that each CMOS circuit corresponds to a known operating temperature, and the rate of degradation associated therewith can be included in the calculation of duration based upon a measured degradation). Alternatively, compensation for the degradation caused by different operating conditions (e.g., temperature) can be accomplished by varying the stress mechanism (e.g., by increasing and/or decreasing the stress voltage applied to the gate, or by changing a duty cycle of a set stress voltage) to compensate for the operating condition.

FIG. 1 is a block diagram of an electronic device/system (e.g., a semiconductor memory device 100, such as a DRAM device) in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals (CMD) and address signals (ADDR), respectively. The memory device may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals (CMD), address signals (ADDR), and chip select signals (CS), from a memory controller. The command signals may represent various memory commands from the memory controller (e.g., including access commands, which can include read commands and write commands). The select signal may be used to select the memory device 100 to respond to commands and addresses provided to the command and address terminals. When an active chip select signal is provided to the memory device 100, the commands and addresses can be decoded and memory operations can be performed. The command signals may be provided as internal command signals ICMD to a command decoder 115 via the command address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 117 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with a power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level, a complementary clock signal is at a high level, and when the clock signal is at a high clock level, the complementary clock signal is at a low clock level. Moreover, when the clock signal transitions from the low clock level to the high clock level, the complementary clock signal transitions from the high clock level to the low clock level, and when the clock signal transitions from the high clock level to the low clock level, the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player, etc.), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to the memory device (e.g., over a networked connection or through intermediary devices).

The memory device 100 can include a data logger circuit 185 for logging data from one or more sensors 180 and/or from other components of the device (e.g., the address command input circuit 105, one or more of the decoders 110/115/140/145, etc.). The data logger circuit can include a CMOS device (e.g., a PMOS device or an NMOS device) configured to degrade (e.g., NBTI-based degradation or CHC-based degradation) according to the targeted usage information. The memory device 100 can further adjust or vary the amount of degradation for each occurrence to compensate for other factors or conditions (e.g., operating temperature) that influence degradation. In some embodiments, the memory device 100 can adjust the amount of degradation by adjusting a stress voltage used to degrade the CMOS. In some embodiments, the memory device 100 can adjust a duty cycle of a stress input used to degrade the CMOS. Although shown as a separate functional block in FIG. 1, a memory device can include the data logging circuit 185 within any of the other components described above, such as the command address input circuit 105, the input/output circuit 160, etc. Also, a memory device can include other connections for the data logging circuit 185. For example, the data logging circuit 185 can be connected to other circuits, such as the address command input circuit 105, one or more of the decoders 110/115/140/145, etc. for including trigger conditions therefrom.

FIG. 2 illustrates a block diagram of the data logging circuit 185 in accordance with an embodiment of the present technology. The memory device 100 can include the data logging circuit 185 operably coupled to one or more operating circuits 204 (e.g., the sensors 180 of FIG. 1, other circuits described above, etc.) that provide information about real-time operating conditions of the memory device 100. The data logging circuit 185 can include circuitry (e.g. CMOS devices) configured to predictably degrade a material characteristic thereof for the duration of the application of a stressing input corresponding to the occurrence of a targeted operating condition.

The operating circuit 204 can include various circuits, such as the sensors (e.g., temperature sensors) and/or other functional circuits, such as receivers, buffers, input pins, amplifiers, decoders, mode registers, etc., utilized in conventional electronic devices (e.g., DRAM or other memory devices). As an example, the operating circuit 204 can include circuits configured to communicate (e.g., receive and/or send) and/or process addresses, commands, etc. Accordingly, the operating circuit 204 can provide information about real-time operating conditions to the data logging circuit 185. For example, the operating circuit 204 can provide device sensor data 212 (e.g., sensed temperature), operating data 214 (e.g., operating mode, address, command, etc.), etc. to the data logging circuit 185.

In some embodiments, the data logging circuit 185 can include one or more trigger circuits 222 configured to degrade (e.g., cause physical changes to) the degradation-based storage circuits 224 (e.g., CMOS degradation-based sensor cores) based on the real-time operating conditions. The trigger circuits 222 can each include a logic block configured to determine an occurrence of a specific condition from the information about real-time operating conditions (e.g., the sensor data 212, the operating data 214, etc.). For example, with simple binary logic, the trigger circuits 222 can be configured to assert a stress input to a corresponding degradation-based storage circuit 224 for the duration during which a specific operating temperature is sensed, a specific operating mode is enabled, a specific command and/or address signal is asserted, or some combination thereof, etc. In this regard, when the target conditions are met, a trigger circuit 222 can assert a driver enabled signal to turn on a signal driver that generates a stress input for a corresponding storage circuit 224. Alternatively, a pre-existing voltage (e.g., not from a dedicated driver) can be connected by a simple switch in the trigger circuit 222 to the corresponding storage circuit 224 in response to the target conditions being met. Details regarding connections between the trigger circuits 222 and the degradation-based storage circuits 224 are described in greater detail below with respect to FIGS. 3-5.

The data logging circuit 185 can further include a read circuit 228 configured to sense the cumulative degradation of the storage circuits 224 and to calculate a corresponding duration based upon the known temperature range at which the degradation occurred and the predetermined voltage asserted as a stress input thereto. The read circuit 228 can output or store data corresponding to the calculated duration.

Using the various circuits, the memory device 100 can determine the operational data (e.g., operating circuit data and/or sensor data) during operation thereof. The memory device 100 can use the operating circuit 204 (e.g., temperature sensors, ambient pressure sensors, the address/command input circuit 105 of FIG. 1, the clock input circuit 120 of FIG. 1, the input/output circuit 160 of FIG. 1, etc.) to determine the operating condition information (e.g., the device sensor data 212, the operating data 214, etc.). The data logging circuit 185 can determine the operating conditions based on receiving the operating condition information from the operating circuit 204.

FIG. 3 illustrates a block diagram of a connection scheme 300 within the data logging circuit 185 of FIG. 2 in accordance with an embodiment of the present technology in which a single sensor core is provided for each trigger circuit. As can be seen with reference to FIG. 3, the data logging circuit 185 can include n trigger circuits (e.g., trigger circuits 302a through 302n) and a corresponding n sensor cores (e.g., sensor cores 304a through 304n), configured so that each data logging circuit 185 of the trigger circuits is dedicated to and directly connected to a unique sensor core.

In embodiments in which a single sensor core may not suffice to provide enough data storage capacity to record the cumulative duration of a targeted condition, additional sensor cores can be provided with a variety of alternative connection schemes. For example, FIG. 4 illustrates a block diagram of a connection scheme 400 within the data logging circuit 185 of FIG. 1, in accordance with a further embodiment of the present technology in which the trigger circuits 222 are each configured to degrade a dedicated set of multiple degradation-based storage circuits 224. For example, the data logging circuit 185 can include a number (e.g., n) of trigger circuits (e.g., trigger circuits 402a through 402n). Each of the trigger circuits can be operably connected to a set of one or more sensor cores through a set of connection switches 406. Each of the trigger circuits 402 can be operably connected to a corresponding set of sensor cores 404 (e.g., sensor sets 404a through 404n) that are dedicated to the corresponding trigger circuit 402. The sets of sensor cores 404 can be dedicated such that they are only able to connect to the corresponding trigger circuit and are otherwise electrically isolated from the other trigger circuits.

As illustrated in FIG. 4, a first trigger circuit 402a can be configured to connect to a first set of sensors 404a, a second trigger circuit 402b to a second set of sensors 404b, an nth trigger circuit 402n to an nth set of sensors 404n, etc. Each of the sensor sets can include a predetermined number of (e.g., i, j, k, or any number) sensor cores according to a desired data storage capacity corresponding to the targeted condition (e.g., for recording the duration for which a memory device is operated at different temperatures, it may be expected that the memory device will operate more frequently in temperature bands at or above room temperature, and less frequently in temperature bands below, such that additional storage capacity for recording the duration of elevated temperatures can be provided).

The data logging circuit 185 can utilize each of the sensor cores as a unit of storage. For example, the data logging circuit 185 can degrade a first sensor core in the set 404a to track the targeted condition until the degradation reaches a predetermined limit (e.g., a limit of reliable or predictable degradation for a given controlled stress stimulus). The data logging circuit 185 (e.g., the read circuit 228 and/or a separate control circuit) can monitor the amount of degradation in the sensor core. When the amount or degree of degradation of the first sensor core reaches the predetermined limit, the data logging circuit 185 (e.g., the read circuit 228 and/or a separate control circuit) can operate the connection switches 406 to disconnect the first sensor core and connect a second sensor core and continue monitoring the targeted or watched criteria with a new sensor core. Accordingly, the sensor cores that reach the predetermined limit of degradation (e.g., disconnected switches that precede the currently connected switch according to a predetermined sequence in the sensor core set) can represent a predetermined duration of the condition being targeted by the trigger circuit and the corresponding sensor core set.

Figure 5:
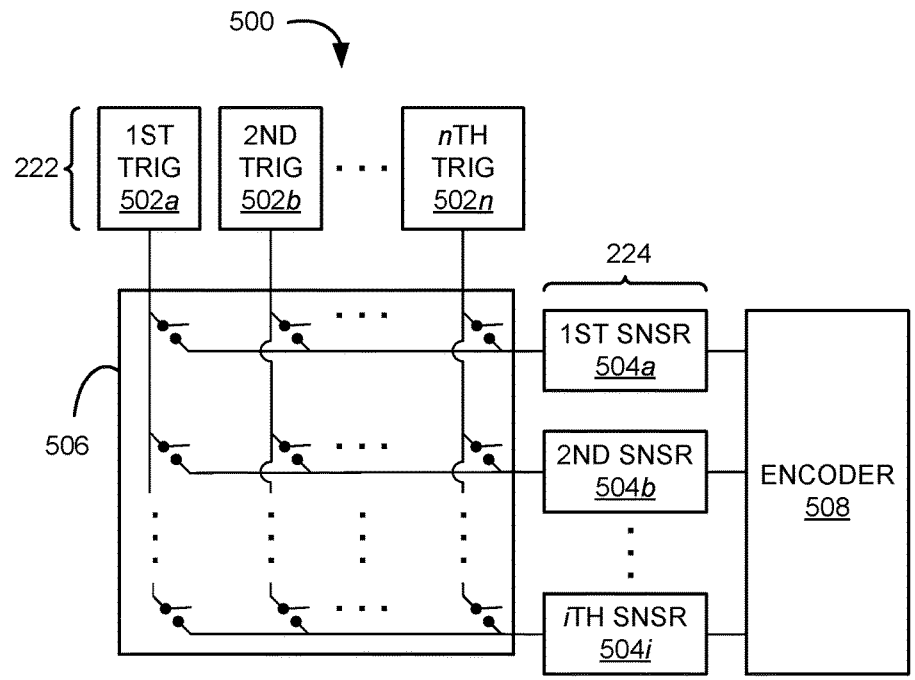
FIG. 5 illustrates a block diagram of a connection scheme within the data logging circuit of FIG. 2 in accordance with a further embodiment of the present technology.

Rather than providing each targeted condition with a dedicated pool of sensor cores as illustrated in FIG. 4, in another embodiment a common pool of sensor cores can be provided to a number of trigger circuits recording the duration of different targeted conditions via a switch matrix. For example, FIG. 5 illustrates a block diagram of a connection scheme 500 within the data logging circuit 185 of FIG. 1 in an embodiment in which the trigger circuits 222 are each configured to degrade corresponding cores from a general/non-dedicated set of degradation-based storage circuits 224. In this regard, the data logging circuit 185 can include a number (e.g., n) of trigger circuits 502 (e.g., trigger circuits 502a through 502n) and a number (e.g., i) of general or non-dedicated sensor cores 504 (e.g., sensor cores 504a through 504i). The trigger circuits 502 can be operably connected to the sensor cores 504 through a switch matrix 506 that is configured to control connections between the trigger circuits 502 and the sensor cores 504. Using the switch matrix 506, each of the trigger circuits 502 can be connected to any of the sensor cores 504.

The data logging circuit 185 (e.g., the read circuit 228 and/or a separate control circuit) can control the switch matrix 506 to connect each of the trigger circuits 502 to a sensor core 504. To store the usage information, the data logging circuit 185 can degrade the connected sensor core when the trigger circuit 502 detects a targeted criteria. During operation, the data logging circuit 185 can further monitor the degree of degradation in the connected sensor core. When the degradation reaches a predetermined limit (e.g., a limit of reliable or predictable degradation for a given stress stimulus), the data logging circuit 185 can disconnect the corresponding sensor core and connect a new/unused sensor core to the corresponding target circuit. The removed sensor core can remain isolated from trigger circuits, and the number of removed sensor cores can represent, together with the partially-degraded currently-connected core, the cumulative duration for which the corresponding trigger circuit asserted a stress input corresponding to a targeted condition.

In some embodiments, the data logging circuit 185 (e.g., the read circuit 228 and/or a separate control circuit) can track the removed (e.g., fully degraded) sensor cores and the event that the sensor represents. In some embodiments, the data logging circuit 185 can include an encoder 508 configured to track the removed sensor cores and encode the output to represent the unit of a previously tracked event or condition when the removed sensor is read.

Figure 6:
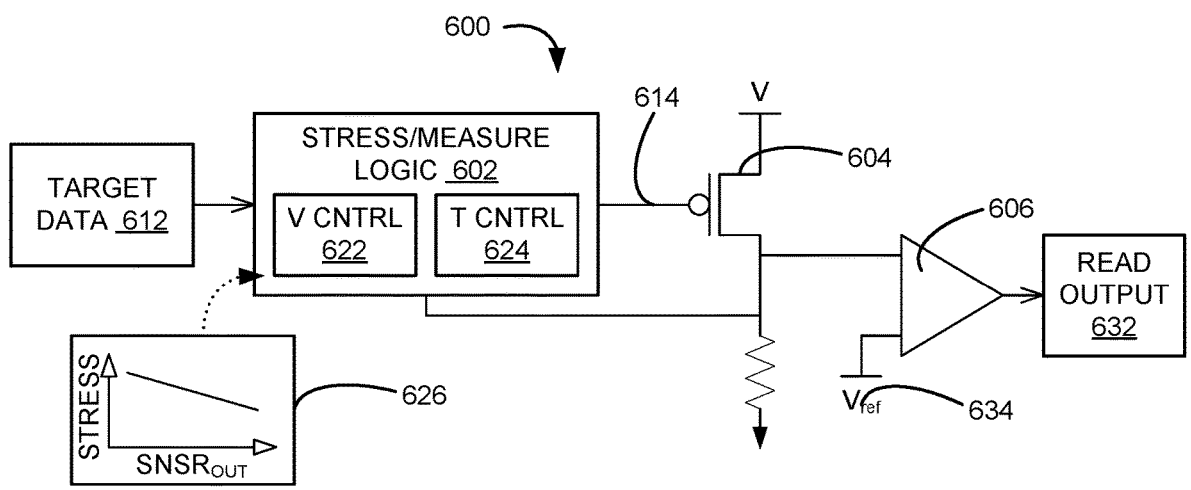
FIG. 6 illustrates a detailed block diagram of the data logging circuit of FIG. 2 in accordance with a further embodiment of the present technology.

FIG. 6 illustrates a more detailed block diagram of the data logging circuit 185 of FIG. 2 in accordance with a further embodiment of the present technology. FIG. 6 illustrates a usage recording circuit 600 that includes instances or portions of the trigger circuits 222 of FIG. 2, the read circuit 228 of FIG. 2, and the degradation-based storage circuits 224 of FIG. 2 that are connected and configured to record a particular usage condition or event. In other words, the usage recording circuit 600 represents one of the trigger blocks of FIGS. 3-5 (e.g., illustrated in FIG. 6 as a stress/measure logic 602) connected to one of the corresponding sensor cores of FIGS. 3-5 (a stress/measure logic 602 e.g., illustrated in FIG. 6 as a CMOS degradation-based sensor 604). The CMOS degradation-based sensor 604 can be further connected to an op-amp reader 606 that represents an instance or a portion of the read circuit 228.

The stress/measure logic 602 can include a logic circuit configured to determine an occurrence of a specified condition or event in target data 612 (e.g., a particular device sensor data 212 of FIG. 2, a particular operating data 214 of FIG. 2, etc.) and generate a stress input 614 (e.g., a signal or a voltage) that stresses/degrades the CMOS degradation-based sensor 604. The op-amp reader 606 can be configured to use a reference input 634 ($V_{ref}$) to generate a read output 632 that corresponds to an amount or a degree of degradation in the CMOS degradation-based sensor 604. For example, the read circuit 228 and/or a control circuit can sweep the reference input 634 to generate the read output 632. As the CMOS degradation-based sensor 604 degrades, the required reference voltage to trigger the op-amp will shift in proportion to the threshold voltage (Vt) shift of the sensor core. The amount of degradation can be obtained by comparing the trigger voltage with a reference or unstressed sensor or with a time zero reading taken and/or stored at the factory during manufacture or initial test.

In some embodiments, the CMOS degradation-based sensor 604 can include a PMOS device configured to degrade according to NBTI. For the PMOS device, the gate can be connected to the stress/measure logic 602, the source can be connected to a voltage source (e.g., a known voltage level, V), and the drain can be connected to the op-amp reader 606, a feedback line to the stress/measure logic 602, a resistor connected to ground, or a combination thereof. In some embodiments, the CMOS degradation-based sensor 604 can include an NMOS device configured to degrade according to CHC. For the NMOS device, the gate can be connected to the stress/measure logic 602, the drain can be connected to the voltage source, and the source can be connected to the op-amp reader 606, the feedback line, the resistor, or a combination thereof.

In some embodiments, degradation of the CMOS degradation-based sensor 604 can be affected by one or more operating conditions. For example, higher operating temperature of the CMOS degradation-based sensor 604 can increase the amount of degradation. Accordingly, the stress/measure logic 602 can receive one or more relevant condition (e.g., operational temperature) information in addition to the watched condition or event. The stress/measure logic 602 can include a control profile 626 that represents an adjustment to the stress input 614 according to the one or more relevant condition information. In other words, the stress/measure logic 602 can generate the stress input 614 based on the control profile 626 such that the degradation to the CMOS degradation-based sensor 604 is dependent on the watched condition and unaffected by other environmental conditions.

In some embodiments, the stress/measure logic 602 can include a stress voltage control circuit 622 and/or a stress time control circuit 624 configured to control the stress input 614 to achieve an appropriate amount of stress or degradation. For example, the stress voltage control circuit 622 can be configured to control a voltage of the stress input 614 to adjust the stress voltage (e.g., between the voltage source, V, and the stress input 614). For operating temperature, the stress voltage control circuit 622 can decrease the stress voltage as the temperature increases. Also, the stress time control circuit 624 can be configured to control a duty cycle of the stress input 614. For operating temperature, the stress time control circuit 624 can decrease the duty cycle as the temperature increases.

Figure 7:
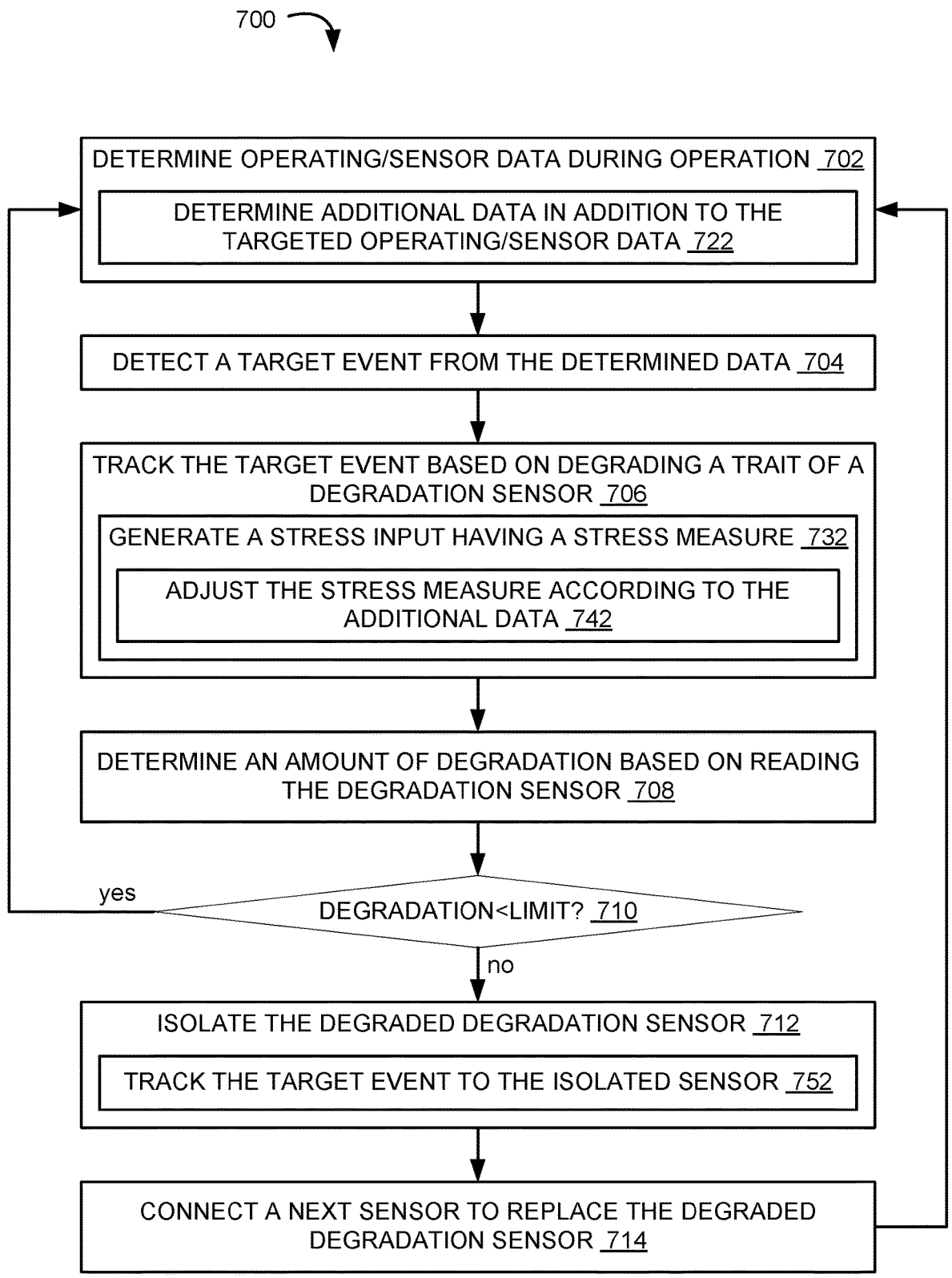
FIG. 7 is a flow diagram illustrating an example method of operating the memory device of FIG. 1 in accordance with an embodiment of the present technology.

FIG. 7 is a flow diagram illustrating an example method 700 of operating the electronic device (e.g., the memory device 100 of FIG. 1) in accordance with an embodiment of the present technology. The method 700 can be for operating the data logging circuit 185 of FIG. 2, the set of the usage recording circuit 600 of FIG. 6 therein, etc. The method 700 can be for tracking and recording operating conditions (e.g., environmental conditions and/or operational data) based on degrading a degradation-based device according to an occurrence of a targeted or watched criteria.

At block 702, the memory device 100 (e.g., volatile memory device, such as DRAM), can determine operational data (e.g., operating circuit data and/or sensor data) during operation thereof. The memory device 100 can use the operating circuit 204 of FIG. 2 (e.g., temperature sensors, ambient pressure sensors, the address/command input circuit 105 of FIG. 1, the clock input circuit 120 of FIG. 1, the input/output circuit 160 of FIG. 1, etc.) to determine the operating condition information (e.g., the device sensor data 212 of FIG. 2, the operating data 214 of FIG. 2, etc.). The data logging circuit 185 can determine the operating conditions based on receiving the operating condition information from the operating circuit 204.

The device sensor data 212, the operating data 214, or a combination thereof can include data associated with targeted criteria. In some embodiments, as represented at block 722, the device sensor data 212, the operating data 214, or a combination thereof can include additional environmental data separate from the targeted criteria. For example, the data logging circuit 185 can include one or more portions of the trigger circuit 222 of FIG. 2 configured to determine occurrence of targeted operating temperatures and/or targeted operating modes. The memory device 100 can determine the temperatures and/or the mode data corresponding to the targeted criteria. Additionally, as an example, the memory device 100 can determine the temperatures for the trigger circuit 222 configured to determine the targeted operating modes. In tracking the targeted operating modes, the data logging circuit 185 can be configured to adjust the degradation stimulus based on the operating temperatures.

At block 704, the memory device 100 can detect one or more target criteria based on the determined data (e.g., the device sensor data 212, the operating data 214, etc.). The data logging circuit 185 (e.g., the trigger circuit 222, such as the first/second/nth trigger circuits illustrated in FIGS. 3-5, the stress/measure logic 602 of FIG. 6, etc.) can compare the determined/received operational data (e.g., the device sensor data 212, the operating data 214, etc.) to a preconfigured/predetermined threshold or range (e.g., targeted operating temperatures, targeted operating modes, targeted commands/addresses, etc.). The data logging circuit 185 can detect the target criteria when the operational data satisfies the threshold or range.

At block 706, the memory device 100 can track the target criteria, such as an amount, an intensity, a duration, and/or a number of occurrences thereof, based on degrading a trait of a degradation sensor (e.g., the degradation-based storage circuit 224 of FIG. 2, such as the first/second/nth degradation sensors/sets thereof of FIGS. 3-5, the CMOS degradation-based sensor 604 of FIG. 6, etc.). For example, based on detection of the target criteria, the data logging circuit 185 (e.g., the trigger circuit 222) can generate the stress input 614 of FIG. 6 configured to degrade a trait of the degradation sensor.

In some embodiments, as represented in block 732, the memory device 100 can generate the stress input having a measure (e.g., the stress voltage, the duty cycle, etc.) configured to control an amount of degradation in the degradation sensor. For example, as represented in block 742, the data logging circuit 185 (e.g., the stress voltage control circuit 622 of FIG. 6, the stress duty-cycle control circuit 624 of FIG. 6, etc.) can adjust the stress measure according to the additional device sensor data. The data logging circuit 185 can adjust the stress measure to offset an amount of degradation caused by the environmental condition (e.g., operating temperature) corresponding to the additional sensor data, such that the degradation of the sensor corresponds to the targeted criteria and is independent of other environmental conditions.

At block 708, the memory device 100 can determine an amount of degradation based on reading the degradation sensor. The data logging circuit 185 can use the read circuit 228, to track/monitor an amount or a degree of degradation in the degradation-based storage circuit 224 by continuously/periodically reading the degradation-based storage circuit 224. For example, the data logging circuit 185 can generate the read output 632 of FIG. 6, such as by sweeping the reference voltage of the op-amp reader 606 of FIG. 6, to track/monitor an amount or a degree of degradation.

At decision block 710, the memory device 100 can compare the amount of degradation (e.g., the read output 632, such as the corresponding threshold voltage) to a predetermined limit. When the degradation is below the predetermined limit, as represented by a loop back to block 702, the memory device 100 can continue using the connected degradation storage circuit to track the targeted criteria.

At block 712, the memory device 100 can isolate the degraded degradation sensor when its degradation level reaches the predetermined limit. The data logging circuit 185 can isolate the degraded sensor from the connected trigger circuit and the associated detection of the target criteria, thereby stopping the degradation of the sensor. For example, the data logging circuit 185 (e.g., the read circuit 228, the trigger circuit 222, etc.) can take the dedicated pair of trigger circuit and sensor (e.g., as illustrated in FIG. 3) offline, such as by disconnecting the pair from the corresponding sensor(s), operating circuit(s), etc. Also, the data logging circuit 185 can operate (e.g., open) one or more switches (e.g., as illustrated in FIG. 4-5) to isolate the degraded sensor.

Once the degradation sensor reaches the predetermined limit and is removed from tracking the targeted criteria, it can represent a unit of data (e.g., a set number of occurrences, duration, magnitude, degree, etc.) for the target criteria. In some embodiments, as represented at block 752, the memory device 100 can track the targeted criteria to the isolated degradation sensor. For example, when the memory device 100 includes a general set of degradation sensors that can be connected to any of the trigger circuits, such as illustrated in FIG. 5, the data logging circuit 185 (e.g., the read circuit 228, the trigger circuit 222, the encoder 508 of FIG. 5, etc.) can track or store information that confirms the isolated sensor corresponds to the previously-tracked targeted criteria. In some embodiments, the encoder 508 can assign a code or encode the data corresponding to the isolated sensor.

At block 714, the memory device 100 can connect a next sensor to replace the degraded sensor. The data logging circuit 185 can connect a next (e.g., according to a predetermined sequence/pattern) degradation sensor to the trigger circuit 222 (e.g., the first/second/nth trigger circuit as illustrated in FIGS. 3-5) in place of the isolated degradation sensor. For example, the data logging circuit 185 (e.g., the read circuit 228, the trigger circuit 222, etc.) can bring online another dedicated pair of trigger circuit and sensor (e.g., as illustrated in FIG. 3) that are configured to track the same targeted criteria to replace the isolated pair. The data logging circuit 185 can connect the new pair to the corresponding sensor(s), operating circuit(s), etc. Also, the data logging circuit 185 operates (e.g., close) one or more switches (e.g., as illustrated in FIG. 4-5) to connect the next undegraded sensor to the corresponding trigger circuit. Once the switch is replaced, the memory device 100 can continue to track the target condition, such as represented by the loop back to block 702.

Figure 8:
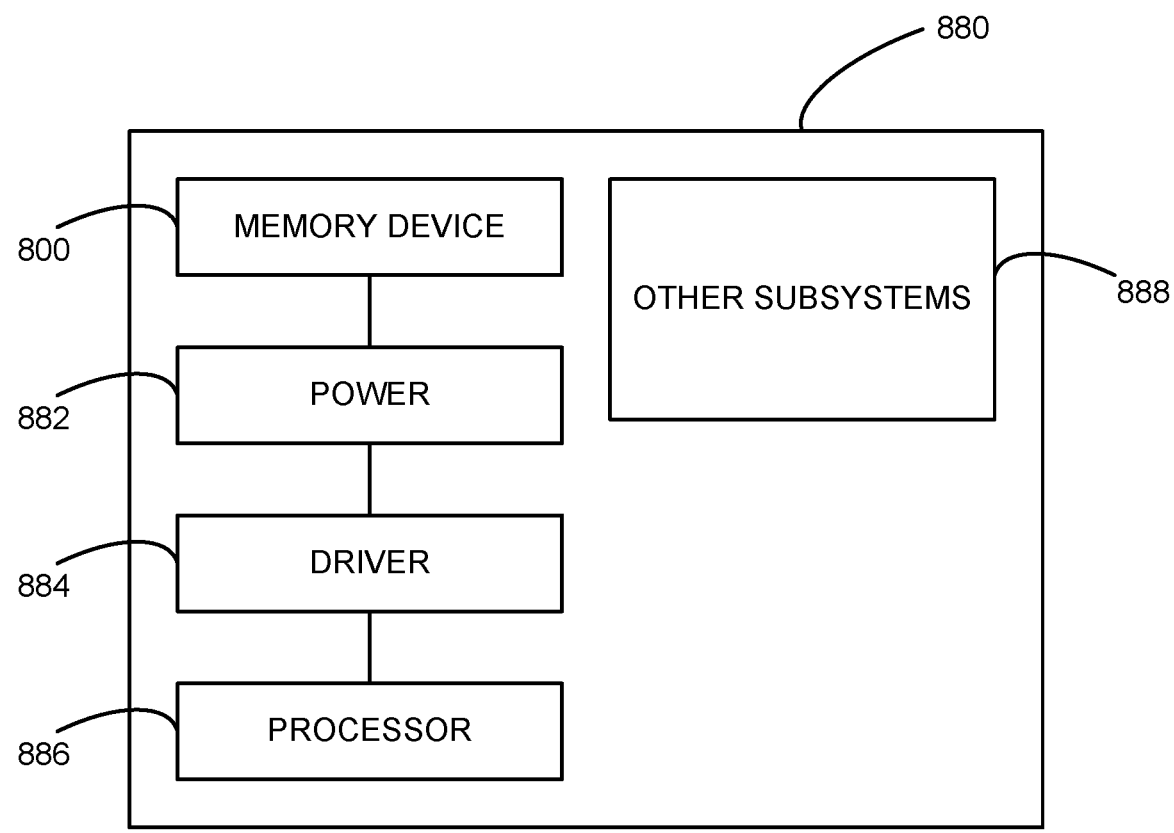
FIG. 8 is a schematic view of a system that includes a memory device in accordance with an embodiment of the present technology.

FIG. 8 is a schematic view of a system that includes a memory device in accordance with embodiments of the present technology. Any one of the foregoing memory devices described above with reference to FIGS. 1-7 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the memory device described above with reference to FIGS. 1-7, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of DRAM devices. Memory devices configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term "data structures" includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-8.

We claim:

1. An electronic device, comprising:
 a detection circuit configured to determine one or more data representative of a temperature, a pressure, a mode, an asserted signal, an address, or a combination thereof that occur during operation of the electronic device;
 a trigger circuit operably coupled to the detection circuit, the trigger circuit configured to generate a stress input based on the detection circuit detecting one or more target criteria from the one or more data; and
 a degradation sensor operably coupled to the trigger circuit, the degradation sensor having a threshold voltage and being configured to store information corresponding to the target criteria based on degradation of the threshold voltage according to the stress input, wherein an amount of degradation in the threshold voltage corresponds to a readable value representative of a cumulative count or duration for the occurrence of the target criteria during operation of the electronic device.

2. The electronic device of claim 1, wherein:
 the degradation sensor is a PMOS device configured to degrade according to negative bias temperature instability (NBTI), and
 the trigger circuit is configured to generate the stress input that increases the threshold voltage according to the NBTI.

3. The electronic device of claim 1, wherein:
 the degradation sensor is an NMOS device configured to degrade according to channel hot carrier (CHC); and
 the trigger circuit is configured to generate the stress input that increases the threshold voltage according to the CHC.

4. The electronic device of claim 1, wherein the detection circuit includes one or more sensors, one or more operating circuits, or a combination thereof, wherein:
 the one or more sensors are configured to generate one or more device sensor data that represent one or more environmental conditions associated with operation of the electronic device; and
 the one or more operating circuits are configured to generate one or more operating data that represent one or more operating parameters associated with operation of the electronic device.

5. The electronic device of claim 4, wherein:
 the one or more environmental conditions include an operating temperature, an ambient pressure, or a combination thereof; and
 the one or more operating parameters include an operating mode of the electronic device, a command asserted at the electronic device, an address associated with an operation executed by the electronic device, or a combination thereof.

6. The electronic device of claim 5, wherein the trigger circuit is configured to detect the target criteria when the device sensor data corresponds to a targeted temperature level or range.

7. The electronic device of claim 5, wherein the trigger circuit is configured to:
 receive an additional device sensor data in addition to the one or more device sensor data, the one or more device sensor data, or a combination thereof that correspond to the target criteria, the additional device sensor data corresponding to an environmental condition outside of the target criteria; and generate the stress input corresponding to a stress measure based on the additional device sensor data, wherein the stress measure is adjusted to change an amount of degradation to the degradation sensor for offsetting an amount of degradation caused by the environmental condition.

8. The electronic device of claim 7, wherein:
the stress measure is a stress voltage between a source and a gate of the degradation sensor; and
the trigger circuit is configured to control a voltage of the stress input to adjust the stress voltage.

9. The electronic device of claim 7, wherein:
the stress measure is a duty cycle configured to control the amount of degradation in the degradation sensor; and
the trigger circuit is configured to generate the stress input having the duty cycle that corresponds to the environmental condition.

10. The electronic device of claim 7, wherein the environmental condition outside of the target criteria includes an operating temperature of the electronic device.

11. The electronic device of claim 1, further comprising:
a second degradation sensor initially disconnected from the detection circuit, the second degradation sensor having the trait and configured to record one or more aspects of operating the electronic device based on degrading the trait;
a reader circuit operably coupled to the degradation sensor, the reader circuit configured to generate a reader output based on the trait of the degradation sensor to represent an amount, an intensity, a duration, and/or a number of occurrence of the target criteria during operation of the electronic device; and
a control circuit coupled to the degradation sensor, the control circuit configured to:
track an amount of degradation in the degradation sensor,
disconnect the degradation sensor from the detection circuit when the amount of degradation reaches a predetermined threshold, wherein the disconnected degradation sensor represents a unit of data corresponding to the target criteria, and
connect the second degradation sensor to the detection circuit for replacing the degradation sensor, wherein the second degradation sensor is configured to track the target criteria in addition to the unit of data.

12. The electronic device of claim 11, further comprising:
a second trigger circuit directly connected to the second degradation sensor and initially disconnected from the detection circuit, the second trigger circuit configured to generate the stress input based on detecting the target criteria from the one or more data;
wherein:
the trigger circuit is directly connected to the degradation sensor; and
the control circuit is configured to:
disconnect the degradation sensor from the detection circuit based on disconnecting the trigger circuit from the detection circuit, and
connect the second degradation sensor to the detection circuit based on connecting the second trigger circuit to the detection circuit.

13. The electronic device of claim 11, further comprising:
a first switch coupled to the trigger circuit and the degradation sensor, the first switch configured to provide a direct connection or isolation between the trigger circuit and the degradation sensor;
a second switch coupled to the trigger circuit and the second degradation sensor, the second switch configured to provide a direct connection or isolation between the trigger circuit and the second degradation sensor; and
wherein:
the degradation sensor and the second degradation sensor are dedicated to track the target criteria;
the trigger circuit is connected to the detection circuit through a static connection; and
the control circuit is configured to:
disconnect the degradation sensor from the detection circuit based on disconnecting the first switch to isolate the trigger circuit from the degradation sensor, and
connect the second degradation sensor to the detection circuit based on connecting the second switch to directly connect the second trigger circuit to the trigger circuit.

14. The electronic device of claim 11, further comprising:
a second trigger circuit configured to generate a second stress based on detecting a second target criteria;
a switch matrix coupled to the trigger circuit, the second trigger circuit, the degradation sensor, and the second degradation sensor, the switch matrix configured to directly connect or isolate each of the trigger circuit and the second trigger circuit relative to the degradation sensor and the second degradation sensor;
wherein:
the degradation sensor and the second degradation sensor are generic devices configured to track any of the target criteria and the second target criteria;
the trigger circuit is connected to the detection circuit through a static connection; and
the control circuit is configured to:
disconnect the degradation sensor from the detection circuit based on operating the switch matrix to disconnect the trigger circuit from the degradation sensor,
connect the second degradation sensor to the detection circuit based on operating the switch matrix to connect the second trigger circuit to the trigger circuit, and
track the disconnected degradation sensor to the target criteria.

15. The electronic device of claim 11, wherein the control circuit or a portion thereof is implemented within the trigger circuit, the reader circuit, or a combination thereof.

16. The electronic device of claim 11, wherein the reader circuit is configured to generate the reader output based on the threshold voltage or a change thereof.

17. The electronic device of claim 1, wherein the electronic device comprises a volatile memory device.

18. A method of operating an electronic device, the method comprising:
determining one or more data representative of a temperature, a pressure, a mode, an asserted signal, an address, or a combination thereof that occur during operation of the electronic device;
detecting one or more target criteria from the one or more data;
degrading a trait of a degradation sensor based on detection of the target criteria, wherein the degraded trait corresponds to a readable value representative of an amount, an intensity, a duration, and/or a number of occurrence of the target criteria during operation of the electronic device tracking an amount of degradation in the degradation sensor;
isolating the degradation sensor from detection of the target criteria to stop the degradation of the degradation sensor, wherein the isolated degradation sensor represents a unit of data for the target criteria; and
connecting a second degradation sensor in place of the degradation sensor to continue tracking the target criteria in addition to the unit of data.

19. The method of claim 18, further comprising:
determining an additional device sensor data in addition to the one or more data that correspond to the target criteria, the additional device sensor data corresponding to an environmental condition outside of the target criteria;
wherein:
degrading the trait of the degradation sensor includes generating a stress input having a duty cycle, a stress voltage, or a combination thereof that is based on the additional device sensor data, wherein the duty cycle, the stress voltage, or a combination thereof is adjusted to change an amount of degradation to the degradation sensor for offsetting an amount of degradation caused by the environmental condition.

* * * * *